United States Patent
Turpin

(10) Patent No.: US 8,324,883 B2
(45) Date of Patent: Dec. 4, 2012

(54) ROGOWSKI CURRENT SENSOR

(75) Inventor: Pierre Turpin, La Roche sur Foron (FR)

(73) Assignee: Liaisons Electroniques-Mecaniques LEM S.A., Plan-les-Ouates (CH)

( * ) Notice: Subject to any disclaimer, the term of this patent is extended or adjusted under 35 U.S.C. 154(b) by 394 days.

(21) Appl. No.: 12/666,903

(22) PCT Filed: Jun. 18, 2008

(86) PCT No.: PCT/IB2008/001581
§ 371 (c)(1),
(2), (4) Date: Dec. 28, 2009

(87) PCT Pub. No.: WO2009/001185
PCT Pub. Date: Dec. 31, 2008

(65) Prior Publication Data
US 2012/0126789 A1    May 24, 2012

(30) Foreign Application Priority Data

Jun. 28, 2007 (EP) .................................. 07405183

(51) Int. Cl.
*G01R 15/18* (2006.01)
*G01R 33/07* (2006.01)
(52) U.S. Cl. ................................. 324/117 R; 324/117 H
(58) Field of Classification Search .............. 324/117 R, 324/117 H, 126, 127, 142, 762.01–762.1, 324/750.01–750.3; 257/48; 438/14–18
See application file for complete search history.

(56) References Cited

U.S. PATENT DOCUMENTS 3,434,052 A * 3/1969 Fechant ......................... 324/127
4,714,880 A * 12/1987 Charmet ........................ 324/258
6,313,623 B1 * 11/2001 Kojovic et al. ................ 324/127

FOREIGN PATENT DOCUMENTS

| DE | 297 06 641 U1 | 5/1997 |
| JP | 08031665 A | 2/1996 |
| WO | WO 99/54740 A | 10/1999 |

OTHER PUBLICATIONS

International Search Report for PCT/IB2008/001581 issued by the European Patent Office on Sep. 10, 2008.
English Translation of the International Preliminary Report on Patentability, for PCT/IB2008/001581, issued by the International Bureau (Bureau international de l'OMPI, geneve 20, Suisse) on Apr. 29, 2010, 6 pages.

* cited by examiner

*Primary Examiner* — Tung X Nguyen
(74) *Attorney, Agent, or Firm* — Faegre Baker Daniels LLP

(57) ABSTRACT

The invention relates to a Rogowski-loop current sensor comprising a winding (4) extending between two ends (14, 16) configured to be provided about a primary conductor in which flows a current to be measured by moving said ends away from or towards each other. The sensor further includes a closing mechanism (18) provided at the ends of the winding, and including a body (20) having a high magnetic permeability and extending between said ends when the loop is closed.

15 Claims, 4 Drawing Sheets

ROGOWSKI CURRENT SENSOR

The present invention relates to a Rogowski loop current transducer.

Referring to FIG. 1, the Rogowski loop 2' comprises, in principle, a coil 4' uniformly distributed around a primary conductor 6 and return wire 8' following the medial axis of the coil. According to Ampere's law and Faraday's law, if the loop follows a closed path around the primary conductor, it returns a signal proportional to the derivative of the current flowing in the primary conductor and also proportional to the mutual inductance M of the coil and conductor:

$$Vi = -M \times \frac{dIp}{dt}$$

According to this law and in the case where the coil is perfect (distribution of turns and closed), the signal only depends on the various current contributions from inside the path, excluding everything on the outside.

One interest of the Rogowski loop is that it can be made in a flexible shape in order to be able to easily open and close it on the conductor to be measured.

The closure point 10', on the other hand, is critical in the sense that it creates a discontinuity in the Ampere path, generating both some sensitivity to external conductors and also to the position of the primary conductor to be measured.

The current state of the art consists of taking great care in the closure system from a mechanical perspective (precision of the positioning) and/or using electrical tricks like using additional compensation turns, without however guaranteeing a result better than 1 to 2% error. The difficulty is accentuated by the fact that one of the ends must be connected to the connection cable 12'. The commonly chosen closing solutions consist in overlapping the two ends of the loop (FIG. 1b) or making the two ends match up (FIG. 1c) but whose implementation requires leaving a small space. It is easily understood that this overlap or residual space tends to increase the discontinuity and therefore the distortion of the measurement.

In light of the aforementioned disadvantages, an objective of the invention is to provide a Rogowski loop current transducer which is precise, adaptable, easy to use, and economical.

Objectives of the invention are achieved by the Rogowski loop current transducer according to claim 1.

In the present invention, a Rogowski loop current transducer comprising a coil extends between two ends configured to be able to be placed around a primary conductor in which a current to be measured flows by separating and bringing back together said ends. The transducer comprises a closing mechanism arranged at the ends of the coil. The mechanism includes a magnetic circuit extending between said ends when the loop is closed. The magnetic circuit can be formed by a body having a high magnetic permeability, such as a body containing or consisting of a ferrite.

Preferably, the body includes cavities or parts of a cavity in which the ends of the coil are housed.

Advantageously, the body of ferromagnetic material makes it possible to close the Rogowski loop very easily while also limiting the measurement imprecisions due to an imperfect closure of the loop and therefore a discontinuity of the Ampere path. The insertion of a piece of magnetic circuit encompassing both ends of the coil reduces or even eliminates the discontinuity in the Ampere path.

The body can advantageously be formed from a whole piece, for example by molding.

In an advantageous variant, the body is permanently attached to one of the ends of the coil and the other end of the coil can be temporarily plugged into a corresponding cavity in the body. The ends of the coil can be aligned or even overlap when the loop is closed.

Other objectives and advantageous aspects of the invention will be apparent from the claims, the following detailed description as well as the attached drawings in which:

Figure 1A:
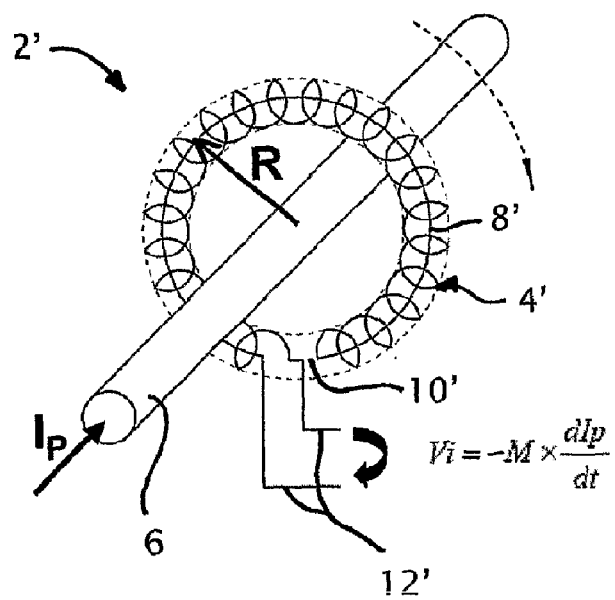
FIG. 1a is a perspective view of a Rogowski loop current transducer according to a known principle.
Figure 1B:
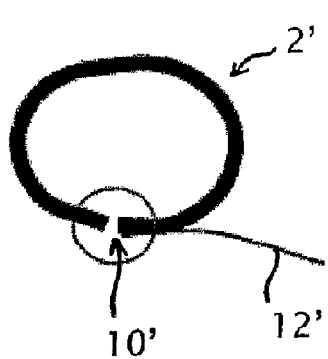
FIGS. 1b and 1c are views of a Rogowski loop current transducer according to a known principle.
Figure 1C:
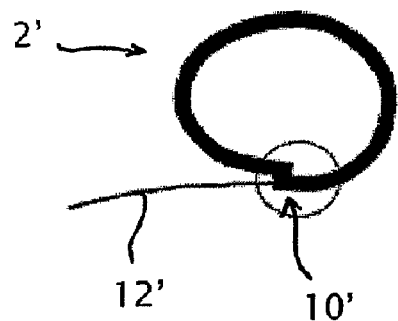

Referring to FIGS. 2a-2c and 3a-3f, a Rogowski loop current transducer 2 includes a conductor coil 4 around a dielectric support (not shown), a conductor return wire 8 essentially following the medial axis of the coil and connected at one end 16 of the coil, a dielectric sheath (not shown) around the coil 4, and a cable 12 or other connection device connected to the other end 14 of the coil and to the return wire. The coil can be formed by a conducting wire essentially uniformly wound around the dielectric support, or by a conductor arranged on a dielectric support, or even by other manufacturing methods making it possible to arrange the coils of a conductor around or in a support in order to form a uniform coil. The sectional profile of the support is preferably circular, but it is also conceivable to have other sectional profiles such as rectangular, oval, triangular, hexagonal, etc.

In place of the medial return wire, the Rogowski loop can comprise a second winding on the first winding such that the two ends of a conducting wire making up the coils end up on the same side. For simplification, below we use the term "coil" of the Rogowski loop to mean a coil with a return wire or two coils.

The cable 12 or other connection device is intended to be connected to a processing circuit (not shown) for processing of the signal provided by the coil in order to generate a measured value of the current passing through the primary conductor 6.

Figure 2A:
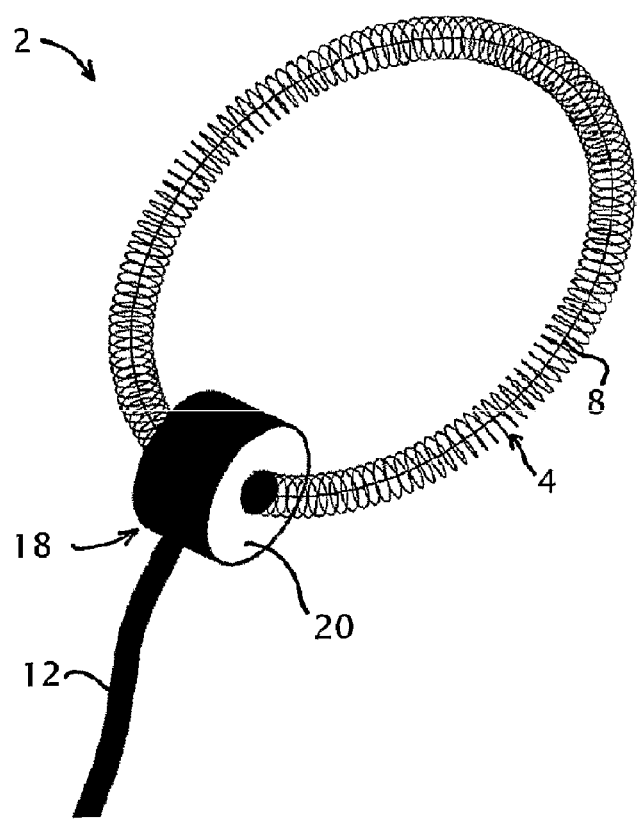
FIG. 2a is a perspective view of a Rogowski loop current transducer according to a first embodiment of the invention (illustrated for simplification without protection or support for the coil).
Figure 2B:
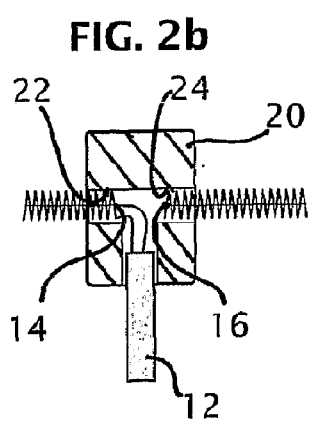
FIG. 2b is a sectional view of the closure part of the transducer from FIG. 2a according to a first variant.
Figure 2C:
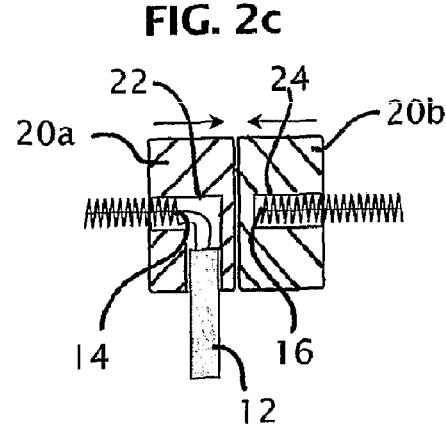
FIG. 2c is a sectional view of the closure part of the transducer from FIG. 2a according to a second variant.
Figure 3A:
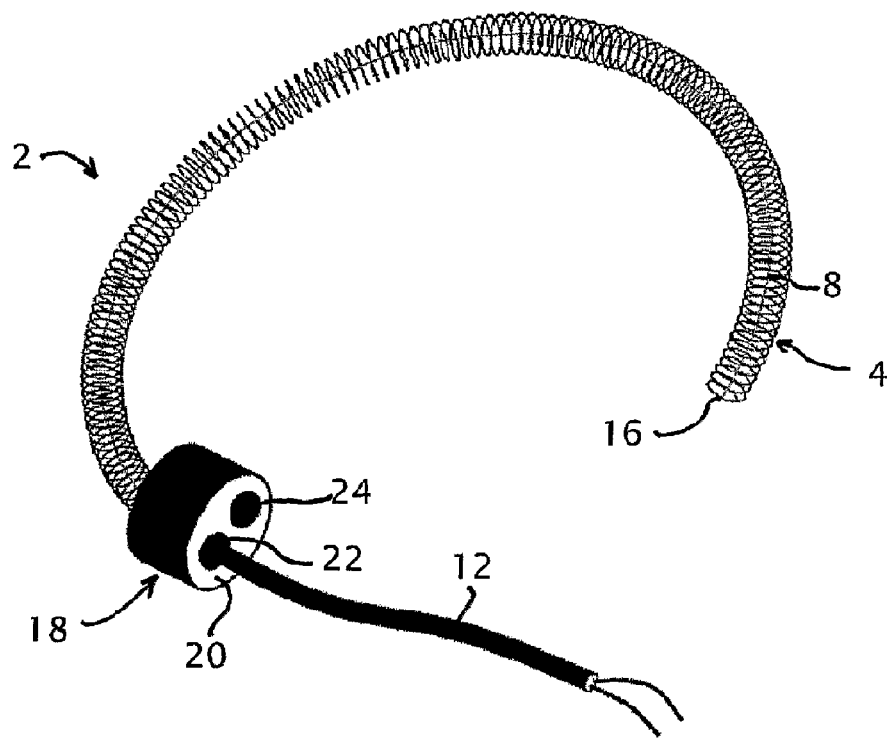
FIG. 3a is a perspective view of a Rogowski loop current transducer according to a second embodiment of the invention in open position (illustrated for simplification without protection or support for the coil).

In the embodiments illustrated, the coil 4, the dielectric support and the sheath form a soft or flexible loop which can be opened (as shown in FIG. 3a) and closed again (as illustrated in FIGS. 2a, 2b, and 3b-3f). This makes it possible to position the loop around a primary conductor 6. It is also conceivable, in the scope of the invention, to wind the coil on a rigid support, for example in two parts with a pivoting or flexible hinge connecting one of the respective ends of each part.

The Rogowski loop current transducer 2 according to the invention furthermore includes a closing mechanism 18 configured for connecting the two ends 14, 16 of the coil when the transducer is in operation around the primary conductor. The closing mechanism comprises a magnetic circuit comprising a body 20, 20a, 20b in one or two parts made of a ferromagnetic material, meaning having a high magnetic permeability relative to the magnetic permeability of air, connecting the ends 14, 16 of the coil. In the embodiments illustrated, the body includes cavities or housings 22, 24 or parts of housings in which the ends 14, 16 are housed in order to be surrounded by the ferromagnetic material. The ferromagnetic material can, for example, be a ferrite or an iron-silicon, iron-nickel alloy or amorphous or nanocrystalline material or plastic loaded with magnetic material. The body 20, 20a, 20b can advantageously be molded in one or two parts from ferrite or a thermoplastic containing a ferromagnetic material, for example particles of a ferromagnetic material. It is also possible, by assembly or overmolding, to integrate the body of ferromagnetic material in a body or box of another material, such as plastic.

The end 16 with the return point can be removably or non-permanently inserted or positioned in the housing. The end 14 connected to the connection device or cable 12 is preferably housed so as to be attached to the closing mechanism by permanent attachment means (for example bonded, crimped, or overmolded) in the cavity or the cavity portion corresponding to the body. The connection end 14 of the coil, the connection device and the closing mechanism can therefore be rigidly connected. The end 14 of the coil can, however, also be connected to the connection device or the cable non-permanently (for example by mechanical attachment clip— not shown) in order to be disassembled and separated from the attachment mechanism.

The body of ferromagnetic material also has the advantage of serving as shielding around the connection wire between the coil and the cable, since this part is sensitive to magnetic fields and could introduce an error in the signal produced.

In order to further reduce the parasitic signals which could be induced in the coil/cable interface and cable itself, a magnetically shielded connection cable can be used which enters into the ferromagnetic body in order to assure the continuity of said shielding. In particular, a cable can be used whose thermoplastic sheath is loaded with a ferromagnetic material.

Figure 3B:
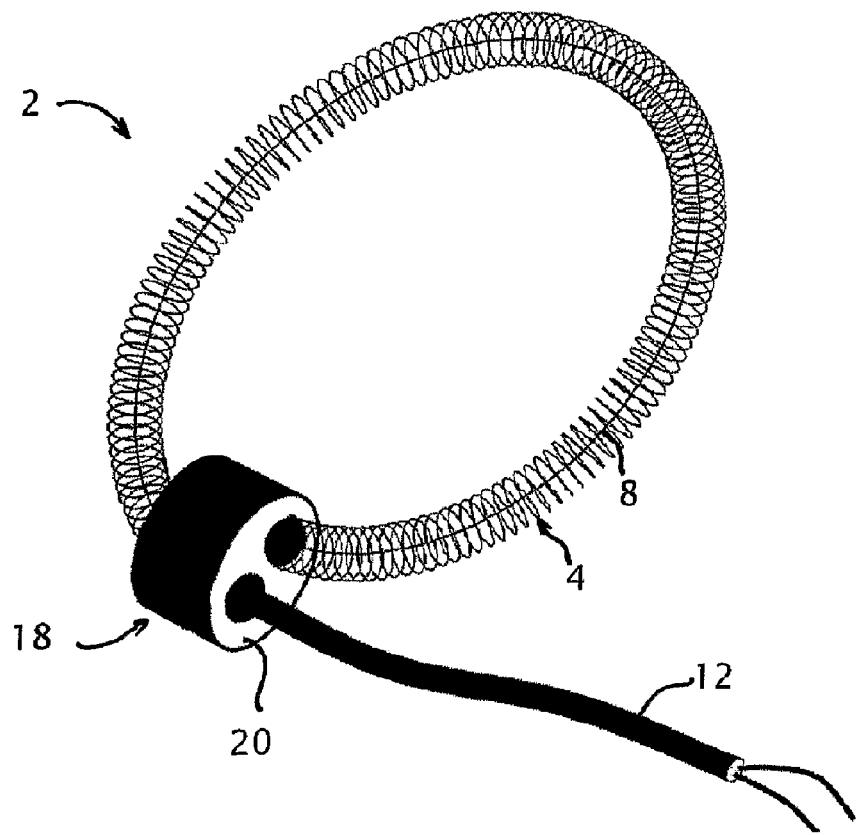
FIG. 3b is a perspective view of the transducer from FIG. 3a in closed position.
Figure 3C:
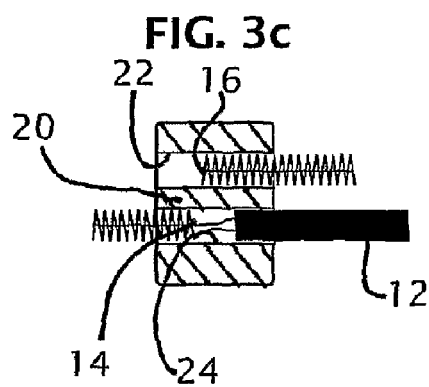
FIGS. 3c to 3f are sectional views of four variants of the transducer closure part from FIG. 3b.
Figure 3D:
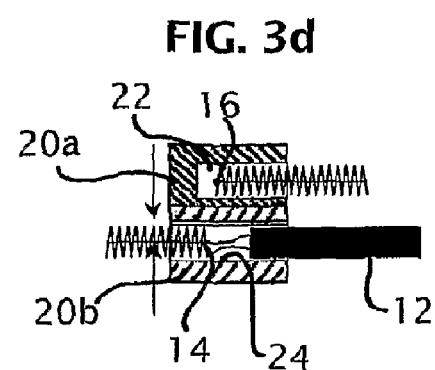
Figure 3E:
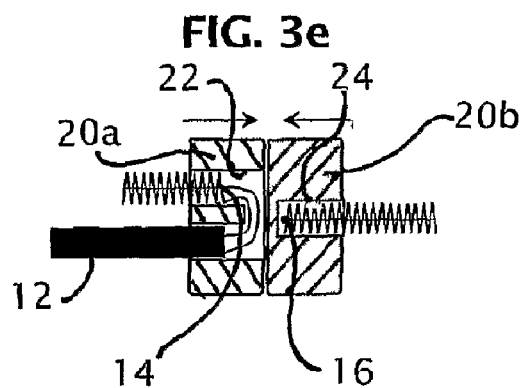
Figure 3F:
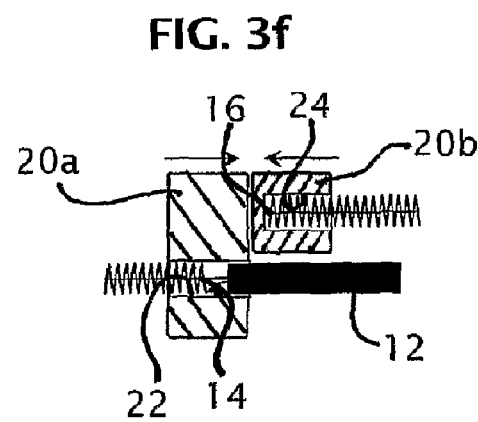

The body of the closing mechanism can be formed from a single part 20, such as shown in FIGS. 2b and 3c, or in two parts 20a, 20b, such as shown in FIGS. 2c and 3d to 3f, or more than two parts, which can be coupled together when the transducer is assembled around a primary conductor. Different means of attachment or locking (for example screw, clip) can be used for the assembly and closure of the parts of the body.

In the embodiment illustrated in FIGS. 2a, 2b, the cavities or cavity parts 22, 24 housing the ends of the coil are arranged in line, whereas in the embodiment illustrated in FIGS. 3a to 3c, the cavities or cavity parts 22, 24 overlap. In these two embodiments, the free end 16 of the coil can simply be inserted in the corresponding cavity for closing the loop around the primary conductor. The free end 16 of the coil can be kept in the cavity by friction or by means of attachment.

In the scope of the invention, instead of having the end inserted in the housing of the body, it is possible to attach each end of the coil permanently in the respective parts of the separable body 20a, 20b which can be coupled together in order to assemble and close the coil around the primary conductor such as illustrated in FIGS. 2c and 3d to 3f.

The closing mechanism 18 can additionally include a box (not shown) in which the body or body parts of ferromagnetic material are mounted along with other components such as a measurement signal processing circuit (not shown) or even connection terminals (instead of the cable) for connection of the transducer to the connection plug in an external device.

In the scope of the invention, it is possible to replace a cavity of the ferromagnetic body in which an end to the coil penetrates with a protuberance of the body penetrating into the end of the coil, in order to connect the ends of the coil by a magnetic circuit.

The body of ferromagnetic material makes it possible to close the Rogowski loop very easily while also limiting the measurement imprecisions due to an imperfect closure of the loop resulting in a discontinuity of the Ampere path. The insertion of a bit of magnetic circuit encompassing, or inserted in, both ends of the coil reduces or even eliminates the discontinuity in the Ampere path. A magnetic material with a permeability, for example 50 to 1,000 times greater than that of air, creates a magnetic short-circuit which amounts to making the two ends coincide. From the magnetic perspective, the Ampere path is then complete and essentially free of discontinuity, which notably improves the effect of insensitivity to magnetic fields outside the loop and to the positioning of the primary conductor to be measured inside the loop.

Advantages of the transducer according to the invention are:

Easy and reliable re-closure of the coil around a primary conductor: once the free end penetrates in the magnetic circuit, the path is complete and the precision optimal No need for complex or precision mechanics for attaching the free end Possible use of ferrite material which is low cost and suitably shaped (shape resulting from molding)

Overlap of the ends has no consequence on the sensitivity to external magnetic fields or the positioning of the primary conductor.

The invention claimed is:

1. Rogowski loop current transducer comprising a coil extending between two ends, said coil configured to be able to be placed around a primary conductor in which a current to be measured flows by separating and bringing back together said two ends, the transducer further comprising a closing mechanism arranged at the ends of the coil when the coil, wherein the closing mechanism comprises a magnetic circuit extending between said ends when the loop is in a closed configuration, the magnetic circuit includes a body having a high magnetic permeability, at least one part of the body is permanently attached to at least one of said two ends of the coil, the other of the said two ends of the coil is pluqqable in a non-permanent manner into a corresponding cavity of the body.

2. Transducer according to claim 1, wherein the body includes at least one cavity or cavity portion in which at least one of said two ends of the coil is inserted.

3. Transducer according to claim 2, wherein the body includes at least one protuberance inserted in at least one of said two ends of the coil.

4. Transducer according to claim 1, wherein the body includes at least one protuberance inserted in at least one of said two ends of the coil.

5. Transducer according to claim 2, wherein the body comprises ferrite.

6. Transducer according to claim 2, wherein the body is formed of a single part.

7. Transducer according to claim 2, wherein the body comprises at least two separable parts.

8. Transducer according to claim 1, wherein the body comprises ferrite.

9. Transducer according to claim 1, wherein the body is formed of a single part.

10. Transducer according to claim 1, wherein the body comprises at least two separable parts.

11. Transducer according to claim 1, wherein the other of the said two ends of the coil is permanently attached to another part of the body.

12. Transducer according to claim 1, wherein the two ends of the coil overlap when the loop is in a closed configuration.

13. Transducer according to claim 1, wherein the two ends of the coil are aligned when the loop is in a closed configuration.

14. Transducer according to claim 1, wherein a connection cable is connected to one end of said two ends of the coil, the cable comprising magnetic shielding inserted into the magnetic circuit.

15. Transducer according to claim 1, wherein the connection cable comprises a thermoplastic sheath loaded with a ferromagnetic material.

* * * * *

UNITED STATES PATENT AND TRADEMARK OFFICE
CERTIFICATE OF CORRECTION

| | | |
|---|---|---|
| PATENT NO. | : 8,324,883 B2 | Page 1 of 1 |
| APPLICATION NO. | : 12/666903 | |
| DATED | : December 4, 2012 | |
| INVENTOR(S) | : Pierre Turpin | |

It is certified that error appears in the above-identified patent and that said Letters Patent is hereby corrected as shown below:

In the Claims:

In Claim 1, at column 4, line 43, please delete the phrase "when the coil"

In Claim 1, at column 4, line 49, please delete the word "pluqqable" and replace therewith --pluggable--

Signed and Sealed this
Twenty-fourth Day of September, 2013

Teresa Stanek Rea
*Deputy Director of the United States Patent and Trademark Office*